United States Patent [19]
Kang

[11] Patent Number: 5,821,566
[45] Date of Patent: Oct. 13, 1998

[54] SURFACE EMITTING SEMICONDUCTOR LASER DEVICE AND FABRICATING METHOD OF THE SAME

[75] Inventor: Seok-jin Kang, Suwon, Rep. of Korea

[73] Assignee: Samsung Electronics Co., Ltd., Suwon, Rep. of Korea

[21] Appl. No.: 565,170

[22] Filed: Nov. 30, 1995

[30] Foreign Application Priority Data

Feb. 3, 1995 [KR] Rep. of Korea ............... 1995-1918

[51] Int. Cl.$^6$ ............................................. H01L 33/00
[52] U.S. Cl. ........................ 257/80; 257/449; 372/50
[58] Field of Search ................. 372/43–50; 257/21, 257/80, 449, 14

[56] References Cited

U.S. PATENT DOCUMENTS

| | | | |
|---|---|---|---|
| 5,283,447 | 2/1994 | Olbright et al. | 372/50 |
| 5,424,559 | 6/1995 | Kasahara | 372/46 |
| 5,475,701 | 12/1995 | Hibbs-Brenner | 372/50 |
| 5,577,064 | 11/1996 | Swirhun et al. | 372/50 |
| 5,606,572 | 2/1997 | Swirhun et al. | 372/50 |

*Primary Examiner*—A. Zarabian
*Attorney, Agent, or Firm*—Rothwell, Figg, Ernst & Kurz

[57] ABSTRACT

A surface emitting semiconductor laser device is disclosed which comprises a substrate, a pair of reflector stacks for light-reflecting disposed above the substrate, surface emitting laser means having a quantum well area disposed between the pair of reflector stacks, a photodiode for monitoring/modulating a laser beam, and contacting means for ohmically contacting the surface emitting laser means and photodiode, wherein the pair of reflector stacks and the quantum well area between the stacks are deposited on the center of the substrate to form a mesa-type ridge structure, and a predetermined metal layer for constituting the photodiode is formed on both portions of the substrate beside a lower side of the mesa-type ridge structure. A fabricating process thereof can be simplified by forming the metal layer on the upper side of the device only with one-time metal depositing process. Also, there is a benefit of lowering the laser oscillating critical current by reducing the current diffusion in the substrate by forming a depletion area on the substrate.

4 Claims, 3 Drawing Sheets

$\phi_m = E_o - E_{fm}$ : METAL WORK FUNCTION
$\phi_s = E_o - E_{fs}$ : SEMICONDUCTOR WORK FUNCTION
$E_o$ : VACUUM LEVEL
$E_{fm}$ : METAL FERMI LEVEL
$E_{fs}$ : SEMICONDUCTOR FERMI LEVEL

SURFACE EMITTING SEMICONDUCTOR LASER DEVICE AND FABRICATING METHOD OF THE SAME

BACKGROUND OF THE INVENTION

The present invention relates to a surface emitting semiconductor laser device and a fabricating method thereof where an LD (laser diode) and a PD (photodiode) are integrated on a single chip, and more particularly to a surface emitting semiconductor laser device and a fabricating method thereof, which can automatically monitor an output of the LD by using a geometrical structure of the LD, preventing an unnecessary loss of a laser beam incurring efficiency reduction in the device and simplifying a fabricating process of the device.

A semiconductor laser device is widely used not only in an optical information processor such as a CDP (compact disc player) or an LDP (laser disc player) but also as an optical communication device. With such a wide use, the semiconductor laser device is often assembled into a single module with an additional PD for monitoring its output in order to produce a stable output when operating. In the above method of monitoring an output of the LD using the additional PD, the assembly of the LD and PD is cumbersome and an additional cost of the PD is incurred. To solve the above problems, a study of a monolithic integration of the LD and PD in fabricating a surface emitting semiconductor laser, has been vigorously undertaken.

An example of a conventional surface emitting semiconductor laser is shown in FIG. 1. Referring to the that figure, in the conventional surface emitting semiconductor laser, a quantum well active region 10 is disposed between a pair of upper and lower Bragg reflector stacks 11 and 12. Above upper Bragg reflector stack 11, an intrinsic semiconductor layer 13 and a doped semiconductor layer 14, forming a photodiode in the path of emitted light, are deposited. Also, beneath lower Bragg reflector stack 12, an n-GaAs substrate 15 is placed. An ohmic contact 18 is provided on the lower surface of substrate 15. Reference numeral 16 represents an annular ohmic contact, 17 is an upper annular ohmic contact, 19 is an active region, and 20 is emitted light.

When the conventional surface emitting semiconductor laser having such a structure is forward biased using upper and lower ohmic contacts 17 and 18, light is emitted from active region 19. The light is emitted outward after passing through upper Bragg reflector stack 11, intrinsic semiconductor layer 13 and doped semiconductor layer 14. In the above process, the uppermost part in upper reflector stack 11, intrinsic semiconductor layer 13 and doped semiconductor layer 14 fully acts as the photodiode formed on the path of emitted light. When bias is applied by annular ohmic contacts 16 and 17, the above photodiode can be used to either modulate laser beam or monitor laser output.

FIG. 2 shows an equivalent circuit diagram of the surface emitting semiconductor laser device having the laser diode and photodiode of FIG. 1. Referring to FIG. 2, when photodiode current $I_P$ is applied to a feedback circuit for controlling laser diode current $I_L$ the integrated structure of FIG. 1 behaves as a self-monitoring laser. On the other hand, if a modulated bias voltage is applied between photodiode voltage $V_{PD}$ and ground, variation in the bias will change the absorption coefficient and refractive index of the photodiode, thereby modulating the amplitude and/or phase of the laser output. In this mode, the integrated structure acts as an integrated laser and a modulator. In FIG. 2, $R_P$ and $R_N$ are resistances in p-Bragg reflector stack 11 and n-Bragg reflector stack 12, and $R_S$ is resistance of upper ohmic contact 17.

Such a conventional surface emitting semiconductor laser has the capability of monitoring directly the laser beam emitted upward by forming a P-I-N type photodiode by additional crystal growing above an emission region. However, since the light emitting outward is considerably absorbed while passing the P-I-N type photodiode, quantum efficiency of the device is sharply reduced. It is also difficult to go through a metal process twice in a fabricating process in order to form the p-ohmic metal contact and the n-ohmic metal contact on the upper and lower parts of the device, respectively.

SUMMARY OF THE INVENTION

To solve the above problems, it is an object of the present invention to provide a surface emitting semiconductor laser device and a fabricating method thereof, by which a fabricating process can be simplified and an unnecessary loss of a laser beam according to a drop in the quantum efficiency of the device can be prevented.

Accordingly, to achieve the above object, there is provided a surface emitting semiconductor laser device which comprises a substrate; a pair of reflector stacks for light-reflecting disposed above the substrate; surface emitting laser means having a quantum well area disposed between the pair of reflector stacks; a photodiode for monitoring/modulating a laser beam; and contacting means for ohmically contacting the surface emitting laser means and photodiode, wherein the pair of reflector stacks and the quantum well area between the stacks are deposited on the center of the substrate to form a mesa-type ridge structure. A predetermined metal layer for constituting the photodiode is formed on both portions of the substrate beside a lower side of the mesa-type ridge structure. The objects of the present invention are also achieved by a fabricating method for a surface emitting semiconductor laser device which comprises the steps of depositing in order and growing on a substrate an n-reflector stack, a quantum well active area, a p-reflector stack and a p-contact layer; forming a mesa-type ridge structure on the center of the substrate by a selective etching, after the growing is completed; forming a metal layer for constituting a photodiode on both portions of the substrate beside a lower side of the mesa-type ridge structure, after forming the mesa-type ridge structure; and forming metal layers for upper and lower electrodes on the uppermost part of the mesa-type ridge structure and on the lower surface of the substrate, respectively, after forming the metal layer for constituting the photodiode.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
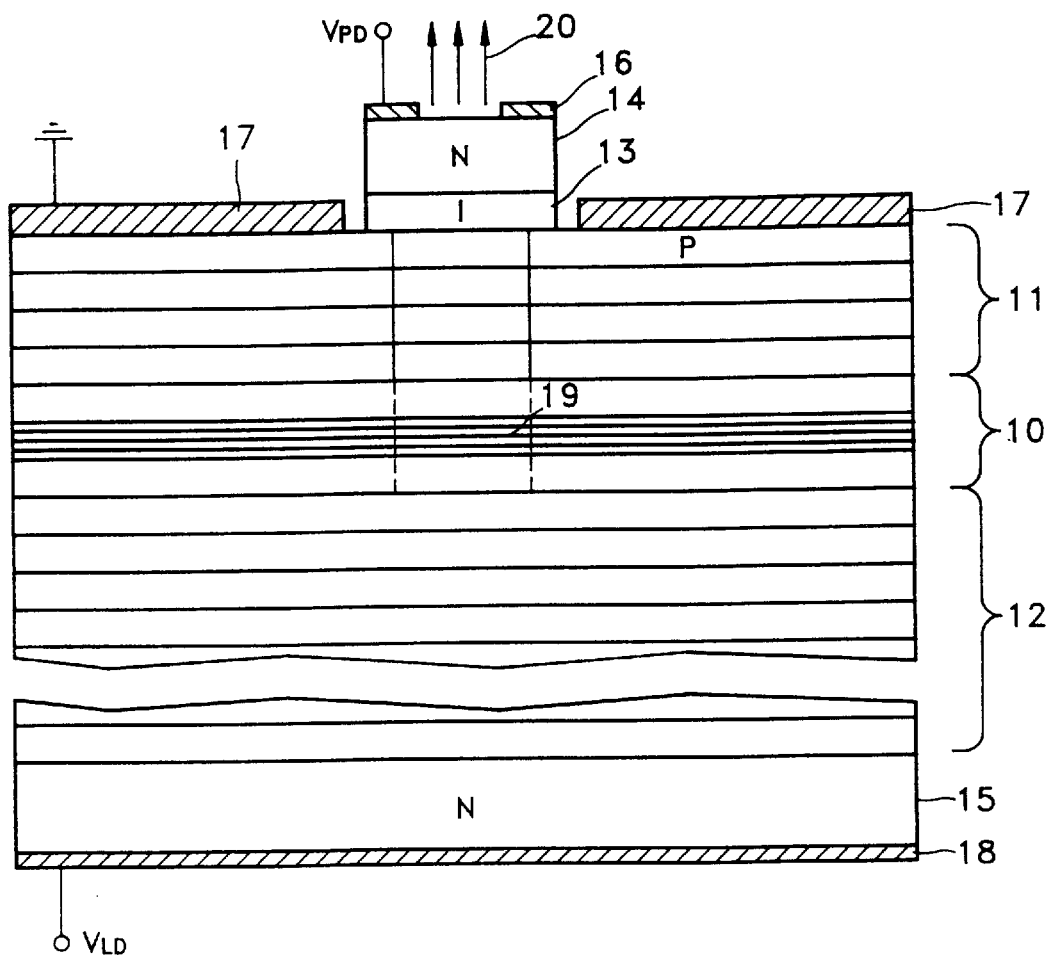
FIG. 1 is a cross section of a conventional surface emitting semiconductor laser device.
Figure 2:
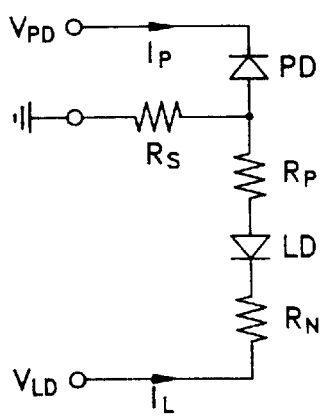
FIG. 2 is an equivalent circuit diagram of the conventional surface emitting semiconductor laser device of FIG. 1.
Figure 3:
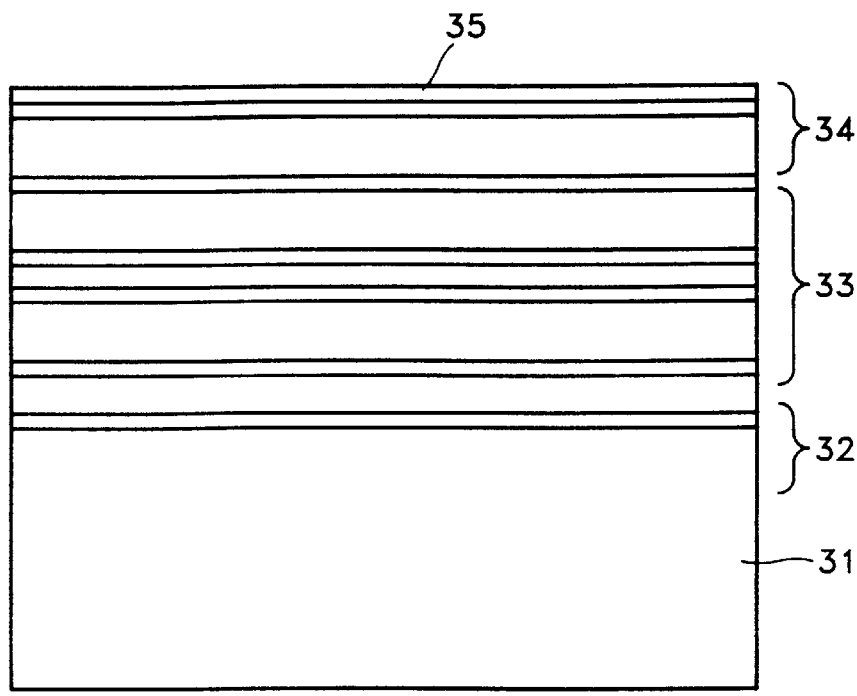
FIG. 3 is a cross section illustrating a fabrication process of a surface emitting semiconductor laser device according to the present invention after a first growth.

Referring to FIG. 3, in a fabrication of a surface emitting semiconductor laser device of the present invention, an n-GaAs substrate 31 is provided. On substrate 31, an n-AlGaAs (or an n-AlAs) Bragg reflector stack 32, a multiple quantum well active region 33, a p-AlGaAs (or a p-AlAs) Bragg reflector stack 34, and a p-GaAs contact 35 are deposited and grown in order. Here, MBE (molecular beam epitaxy), LPE (liquid phase epitaxy) or MOCVD (metal organic chemical vapor deposition) methods are employed in such growth.

Figure 4:
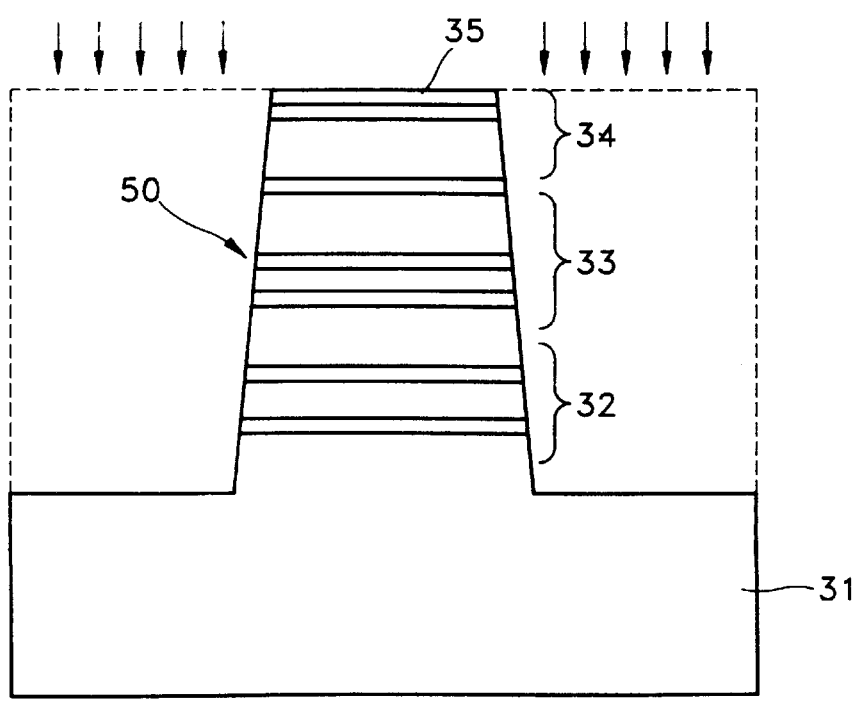
FIG. 4 is a view illustrating a mesa-type ridge formed by a selective etching, in the fabricating process of the surface emitting semiconductor laser device according to the present invention.

When the first growth is completed as described above, a mesa-type ridge 50 is formed on the center of substrate 31 by a selective etching, as shown in FIG. 4. Here, the etching is done to a predetermined depth by the conventional photolithography, after attaching on a surface of p-GaAs contact 35 a mask ($SiO_2$ and $SiN_x$) (not shown) having a predetermined pattern.

Figure 5:
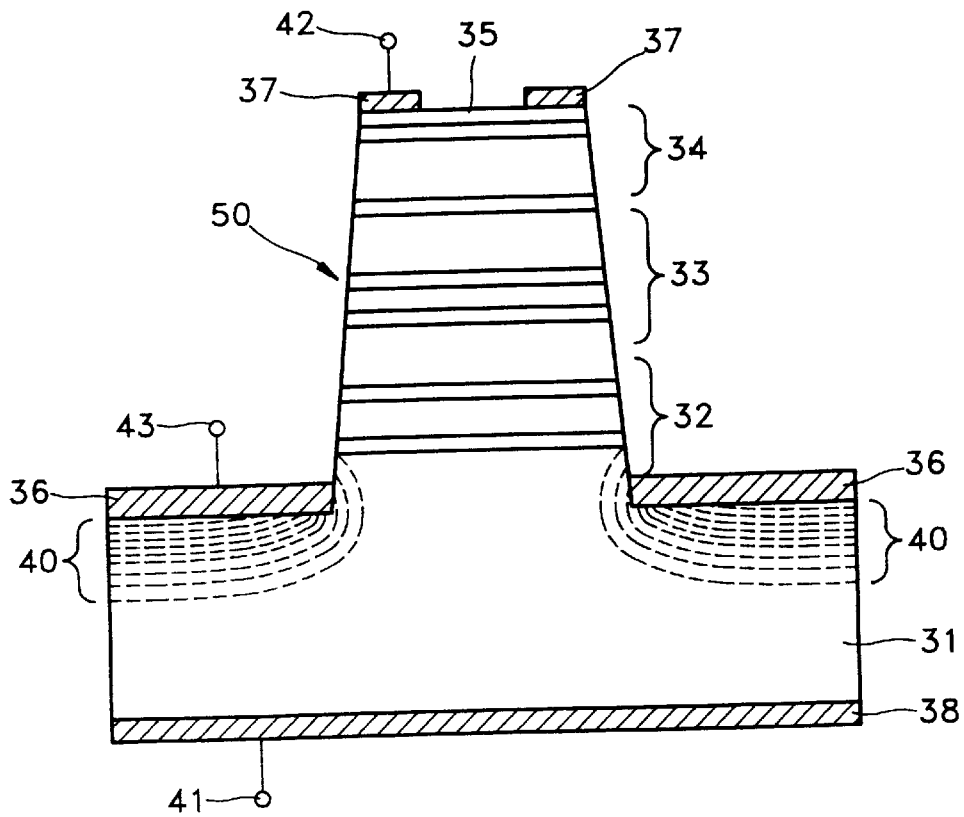
FIG. 5 is a cross section illustrating the completed device formed with metal layers for constituting an electrode and a photodiode, in the fabricating process of the surface emitting semiconductor laser device according to the present invention.

After mesa-type ridge 50 is formed, as shown in FIG. 5, a p-ohmic metal layer 36 for constituting a photodiode is formed on both portions of substrate 31 beside a lower side of mesa-type ridge 50. A p-ohmic metal layer 37 and an n-ohmic metal layer 38 are respectively formed as upper and lower electrodes on the uppermost part of mesa-type ridge 50 and on the lower surface of substrate 31. The device is completed by arranging terminals 41, 42 and 43 on upper and lower metal layers 37 and 38 and p-ohmic metal layer 36. The forming of p-ohmic metal layers 36 and 37 is made by a one-time metal-depositing process. P-ohmic metal layer 36 for the photodiode and upper metal layer 37 for the upper electrode (P electrode) are formed by depositing AuZn and Au. Lower metal layer 38 for the lower electrode (N electrode) is formed by depositing AuGe and Au. Especially, AuZn of p-ohmic metal layer 36 for the photodiode forms with n-GaAs of substrate 31 a Schottky barrier, being a rectifying contact, so that no current flows in equilibrium state between first terminal 41 and third terminal 43 (this will be described in more detail in a below description of operation).

Referring to FIG. 5, the operation of the surface emitting semiconductor laser device having the above structure according to the present invention, will be described.

In FIG. 5, AuZn of p-ohmic metal layer 38 for the electrode and GaAs of n-substrate 31 contact each other resistively, and AuZn of p-ohmic metal layer 37 for the electrode and GaAs of p-contact 35 also make a resistive contact. Thus, a forward bias between first terminal 41 and second terminal 42 provides current smoothly to the laser diode so as to oscillate the device.

On the other hand, since the Schottky barrier is formed between AuZn of p-ohmic metal layer 36 and GaAs of n-substrate 31 and the rectifying contact is accordingly made as described above, no current flows between first terminal 41 and third terminal 43 and a depletion area 40 exists around third terminal 43, in the equilibrium state. The depletion area increases as a reverse bias is applied.

Figure 6:
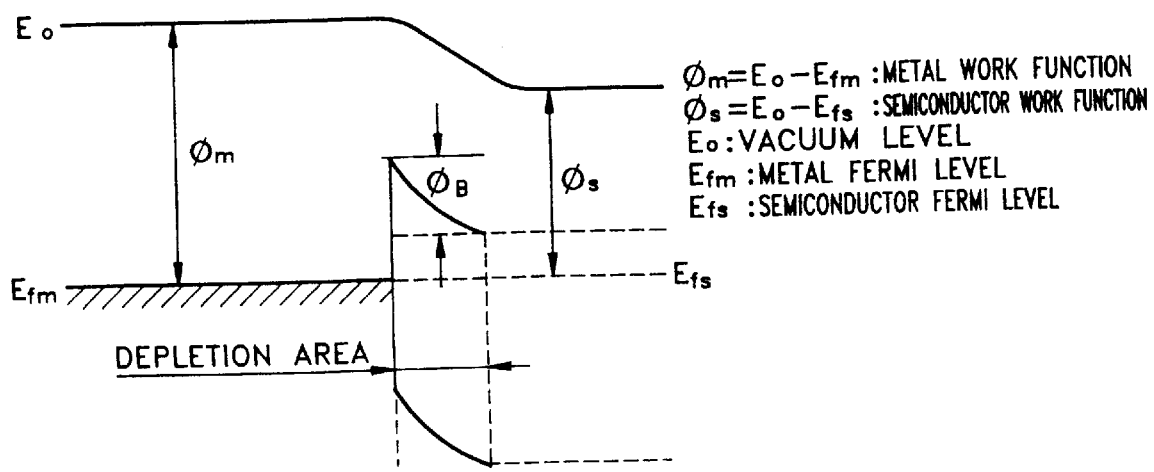
FIG. 6 is a graph schematically showing an energy band structure between AuZn of a metal layer for a photodiode and n-GaAs of a substrate in the surface emitting semiconductor laser device according to the present invention.

On the other hand, the energy band structure between AuZn of p-ohmic metal layer 36 and n-GaAs substrate 31 in the present invention, is shown in FIG. 6.

Referring to the drawing, when $\phi_m > \phi_s$, a depletion area is incurred on the surface of a semiconductor since electrons, carriers on the surface of the semiconductor, transfer inside the semiconductor in the equilibrium state. If positive voltage is applied, $\phi_B$ is reduced as the electrons are transferred to the surface so that the electrons jump easily a barrier to flow forward current. On the contrary, if negative voltage (reverse voltage) is applied, the depletion area on the surface of the semiconductor is expanded. Also, current by the diffusion of electrons hardly flows, and only reverse saturation current by the generation of e-h (electron-hole) pairs in the depletion area exists. The reverse saturation current is determined by the generating rate of the e-h pair. The generating rate of the e-h pair increases as heat energy or light energy is applied. Accordingly, when a part of the laser generated in the upper structure (laser diode) is absorbed into the lower depletion area, the reverse saturation current between third terminal 43 and first terminal 41 increases.

On the other hand, in the operation of the device, when a laser diode oscillates by a forward bias between first terminal 41 and second terminal 42, the absorption of a laser beam is incurred toward substrate 31. When e-h pairs occur in depletion area 40 around third terminal 43 by the laser beam, these carriers are accelerated in a reverse direction by an electric field in depletion area 40 to form photoelectric current. As an output of the laser diode increases with this photoelectric current, chip temperature rises and the reverse saturation current of the photodiode is increased.

Since the current by the photoelectric current and the temperature rise is in proportion to the output of the laser diode, a stable output of light can be maintained by controlling properly the driving current of the laser diode through the variation of the current.

As described above, in the surface emitting semiconductor laser device and fabricating method thereof according to the present invention, the integration of a laser diode and a photodiode can be obtained without additional crystal growing by forming the photodiode on a substrate itself utilizing a metal-Schottky barrier. Also, the fabricating process can be simplified by forming the metal layer on the upper side of the device only with one-time metal depositing process. Further, there is a benefit of lowering the laser oscillating critical current by reducing the current diffusion in the substrate by forming a depletion area on the substrate.

What is claimed is:

1. A surface emitting semiconductor laser device, comprising:

a substrate;

a mesa ridge structure deposited on a first surface of said substrate, said mesa ridge structure including a quantum well semiconductor active region for emitting laser light and a pair of reflector stacks for reflecting light emitted from said active region, said active region being disposed between said pair of reflector stacks;

a first ohmic contact layer deposited on said mesa ridge structure;

a second ohmic contact layer deposited on a second surface of said substrate opposite said mesa ridge structure; and a Schottky contact layer deposited on said substrate on each side of said mesa ridge structure;

wherein said Schottky contact layer and a portion of said substrate form a photodiode for monitoring and/or modulating a light beam emitted from said mesa ridge structure.

2. A surface emitting semiconductor laser device according to claim 1, wherein said Schottky contact layer is a metal layer forming a Schottky barrier contact with said substrate.

3. A surface emitting semiconductor laser device according to claim 1, wherein said Schottky contact layer is a metal layer formed by stacking AuZn and Au.

4. A surface emitting semiconductor laser device according to claim 2, wherein said metal Schottky contact layer is formed by stacking AuZn and Au.

* * * * *